US011567144B2

(12) United States Patent
Yamaguchi

(10) Patent No.: US 11,567,144 B2
(45) Date of Patent: *Jan. 31, 2023

(54) GROUND FAULT DETECTION DEVICE

(71) Applicant: HONDA MOTOR CO., LTD., Tokyo (JP)

(72) Inventor: Hiroyuki Yamaguchi, Saitama (JP)

(73) Assignee: HONDA MOTOR CO., LTD., Tokyo (JP)

(*) Notice: Subject to any disclaimer, the term of this patent is extended or adjusted under 35 U.S.C. 154(b) by 0 days.

This patent is subject to a terminal disclaimer.

(21) Appl. No.: 17/190,033

(22) Filed: Mar. 2, 2021

(65) Prior Publication Data
US 2021/0270910 A1 Sep. 2, 2021

(30) Foreign Application Priority Data
Mar. 2, 2020 (JP) .............................. JP2020-035287

(51) Int. Cl.
*G01R 31/00* (2006.01)
*G01R 31/52* (2020.01)
*G01R 31/64* (2020.01)
*G01R 31/14* (2006.01)
*B60L 3/00* (2019.01)

(52) U.S. Cl.
CPC ............ *G01R 31/52* (2020.01); *B60L 3/0069* (2013.01); *G01R 31/14* (2013.01); *G01R 31/64* (2020.01)

(58) Field of Classification Search
USPC .................. 324/658, 660–663, 679, 686
See application file for complete search history.

(56) References Cited

U.S. PATENT DOCUMENTS

2019/0100104 A1    4/2019  Kawamura
2020/0386827 A1*  12/2020  Takamatsu ......... G01R 31/3835
2021/0072324 A1*   3/2021  Kawamura ........... G01R 27/025

FOREIGN PATENT DOCUMENTS

JP         2019-066402 A       4/2019

* cited by examiner

*Primary Examiner* — Vincent Q Nguyen
(74) *Attorney, Agent, or Firm* — Paratus Law Group, PLLC

(57) ABSTRACT

A ground fault detection device connected to a high-voltage battery and a positive electrode side Y capacitor includes a detection capacitor operating as a flying capacitor and a discharge circuit including at least a fifth switch. A one end of the discharge circuit is connected to a first circuit that connects a positive electrode side of the high-voltage battery and a one end of the detection capacitor. An another end of the discharge circuit is connected to a second circuit that connects an another end of the detection capacitor and a ground.

3 Claims, 8 Drawing Sheets

GROUND FAULT DETECTION DEVICE

CROSS REFERENCE TO RELATED APPLICATIONS

This application claims priority to Japanese Patent Application No. 2020-035287 filed on Mar. 2, 2020, the content of which is incorporated herein by reference.

TECHNICAL FIELD

The present invention relates to a ground fault detection device using a flying capacitor.

BACKGROUND ART

A vehicle such as an electric automatic vehicle or a hybrid electric vehicle that is provided with a motor as a drive source and that runs by the power of the motor is provided with a battery that supplies electric power to the motor. Such a battery related power supply circuit for driving is generally configured as a high voltage circuit that handles a high voltage of 50 [V] or more. In order to secure safety, a high-voltage circuit including such a battery has a non-grounded configuration electrically insulated from a vehicle body serving as a ground reference potential point. A vehicle equipped with a non-grounded high-voltage battery is provided with a ground fault detection device that monitors an insulation state of a system (specifically, an insulation state between a main power supply system from the high-voltage battery to the motor and the vehicle body) provided with the high-voltage battery.

JP 2019-066402 A describes a ground fault detection device connected to a high-voltage battery using a capacitor called a flying capacitor. JP 2019-066402 A describes that a capacitor, which is called a Y capacitor (line bypass capacitor), is connected in parallel with a high-voltage battery.

When the high-voltage battery and the Y capacitor connected in parallel are connected to a ground fault detection device using a flying capacitor, the electric charges accumulated in the Y capacitor may flow into the flying capacitor when the insulation resistance is measured in order to detect a ground fault. From the viewpoint of enhancing the detection accuracy of the ground fault, it is desirable to reduce the amount of the electric charges flowing from the Y capacitor into the flying capacitor as much as possible, and there is room for improvement in this point.

An aspect of the present invention provides a ground fault detection device capable of reducing the electric charges flowing from a Y capacitor into a flying capacitor.

SUMMARY OF INVENTION

A ground fault detection device according to an aspect of the present invention is connected to a high-voltage battery and configured to detect a decrease in insulation resistance of a system provided with the high-voltage battery. The ground fault detection device includes, a detection capacitor operating as a flying capacitor, a control unit configured to measure a voltage of the detection capacitor, a first switch and a first resistor connecting a positive electrode side of the high-voltage battery and one end of the detection capacitor in series, a second switch and a second resistor connecting the negative electrode side of the high-voltage battery and an another end of the detection capacitor in series, a third switch connecting the one end of the detection capacitor and the ground, a fourth switch connecting the another end of the detection capacitor and the ground, and a discharge circuit including at least a fifth switch, having one end connected to a first circuit that connects the positive electrode side of the high-voltage battery and the one end of the detection capacitor, and having an another end connected to a second circuit that connects the another end of the detection capacitor and the ground. The ground fault detection device is connected to a positive electrode side termination resistor that connects the positive electrode side of the high-voltage battery and the ground. The ground fault detection device is connected to a negative electrode side termination resistor that connects the negative electrode side of the high-voltage battery and the ground. The ground fault detection device is connected to a positive electrode side Y capacitor that connects the positive electrode side of the high-voltage battery and the ground in parallel with the positive electrode side termination resistor. The ground fault detection device is connected to a negative electrode side Y capacitor that connects the negative electrode side of the high voltage battery and the ground in parallel with the negative electrode side termination resistor.

DESCRIPTION OF EMBODIMENTS

Hereinafter, an embodiment of a ground fault detection device of the present invention will be described in detail with reference to the drawings.

[Vehicle]

Figure 1:
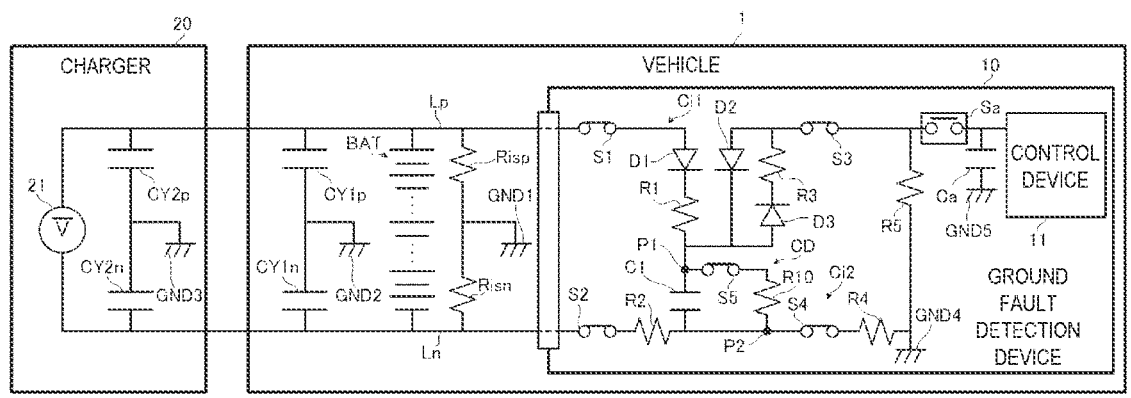
FIG. 1 is a diagram illustrating an example of a vehicle including a ground fault detection device according to an embodiment of the present invention.

First, a vehicle including a ground fault detection device according to the present embodiment will be described with reference to FIG. 1. In FIG. 1, a vehicle 1 is an electric vehicle or a plug-in hybrid electric vehicle. That is, the vehicle 1 includes a motor (not illustrated) serving as a driving source and a high-voltage battery BAT, and is configured to be able to run by a motor outputting power corresponding to the electric power supplied from the high-voltage battery BAT. The high-voltage battery BAT is, for example, a battery capable of outputting a high voltage of 50 [V] or more, and is configured by connecting a plurality of secondary batteries such as a lithium ion battery and a nickel hydrogen battery in series.

As illustrated in FIG. 1, the vehicle 1 may be connected to a charger 20 that outputs electric power of a power supply 21 (for example, a commercial power supply). Specifically the vehicle 1 includes a connector (not shown) that can be connected to the charger 20. The vehicle 1 is configured to be able to charge the high-voltage battery BAT by using electric power received from the charger 20 connected via the connector. The charger 20 is installed in, for example, a facility capable of performing a charging operation with respect to a vehicle 1 such as a so-called charging station.

In the vehicle 1, the positive electrode terminal of the high-voltage battery BAT is connected to a positive electrode side power supply line Lp, and the negative electrode terminal of the high-voltage battery BAT is connected to a negative electrode side power supply line Ln. In addition, the positive electrode side (that is, the positive electrode side power supply line Lp) of the high-voltage battery BAT is connected to the ground GND1 via a positive electrode side termination resistor Risp, and the negative electrode side (that is, the negative electrode side power supply line Ln) of the high-voltage battery BAT is also connected to the ground GND1 via a negative electrode side termination resistor Risn. The ground GND1 is, for example, a vehicle body.

In other words, the positive electrode side termination resistor Risp connects the positive electrode side of the high-voltage battery BAT and the ground GND1, and the negative electrode side termination resistor Risn connects the negative electrode side of the high-voltage battery BAT and the ground GND1. The positive electrode side termination resistor Risp is an insulation resistance between the positive electrode side of the high voltage battery BAT and the ground GND1, and the negative electrode side termination resistor Risn is an insulation resistance between the negative electrode side of the high-voltage battery BAT and the ground GND1. It is assumed that the electric resistance values of the positive electrode side termination resistor Risp and the negative electrode side termination resistor Risn are sufficiently larger than a predetermined insulation resistance value determined to be a ground fault by the control device 11.

In addition, the vehicle 1 is provided with a vehicle positive electrode side Y capacitor CY1$p$ and a vehicle negative electrode side Y capacitor CY1$n$ for the purpose of eliminating high-frequency noise and stabilizing operation in a system (specifically, a main power supply system from the high-voltage battery BAT to a motor serving as a driving source of the vehicle 1) provided with the high-voltage battery BAT. The vehicle positive electrode side Y capacitor CY1$p$ and the vehicle negative electrode side Y capacitor CY1$n$ are so-called Y capacitors (line bypass capacitors).

The vehicle positive electrode side Y capacitor CY1$p$ is connected in parallel to the positive electrode side termination resistor Risp, and connects the positive electrode side (that is, the positive electrode side power source line Lp) of the high-voltage battery BAT and the ground GND2. The vehicle negative electrode side Y capacitor CY1$n$ is connected in parallel to the negative electrode side termination resistor Risn, and connects the negative electrode side of the high-voltage battery BAT (that is, the negative electrode side power supply line Ln) and the ground GND2. The ground GND2 is, for example, the vehicle body. The ground GND2 may be common to the ground GND1.

Similar to the vehicle 1, the charger 20 is also provided with a Y capacitor. Specifically, the charger 20 is provided with a charger positive electrode side Y capacitor CY2$p$ and a charger negative electrode side Y capacitor CY2$n$. The charger positive electrode side Y capacitor CY2$p$ connects the positive electrode side of the power source 21 and the ground GND3. The charger negative electrode side Y capacitor CY2$n$ connects the negative electrode side of the power source 21 and the ground GND3. The ground GND3 is a ground provided to the charger 20.

As illustrated in FIG. 1, in a case where the vehicle 1 is connected to the charger 20, the charger positive electrode side Y capacitor CY2$p$ is connected in parallel to the vehicle positive electrode side Y capacitor CY1$p$, and the charger negative electrode side Y capacitor CY2$n$ is connected in parallel with the vehicle negative electrode side Y capacitor CY1$n$.

Hereinafter, the Y capacitor provided on the positive electrode side (that is, the positive electrode side power supply line Lp) of the high-voltage battery BAT may be referred to as a positive electrode side Y capacitor CY$p$. Specifically, in a case where the vehicle 1 is not connected to the charger 20, the positive electrode side Y capacitor CY$p$ is the vehicle positive electrode side Y capacitor CY1$p$. On the other hand, in a case where the vehicle 1 is connected to the charger 20, the positive electrode side Y capacitor CY$p$ is the vehicle positive electrode side Y capacitor CY1$p$ and the charger positive electrode side Y capacitor CY2$p$ which are connected in parallel.

In addition, hereinafter, the Y capacitor provided on the negative electrode side (that is, the negative electrode side power supply line Ln) of the high-voltage battery BAT may be referred to as a negative electrode side Y capacitor CY$n$. Specifically, in a case where the vehicle 1 is not connected to the charger 20, the negative electrode side Y capacitor CY$n$ is the vehicle negative electrode side Y capacitor CY1$n$. On the other hand, in a case where the vehicle 1 is connected to the charger 20, the negative electrode side Y capacitor CY$n$ is the vehicle negative electrode side Y capacitor CY1$n$ and the charger negative electrode side Y capacitor CY2$n$ which are connected in parallel.

[Ground Fault Detection Device]

As illustrated in FIG. 1, the vehicle 1 further includes a ground fault detection device 10 that detects a ground fault (an insulation state) between a system provided with a high-voltage battery BAT and a vehicle body. The ground fault detection device 10 is an example of a ground fault detection device of the present invention, and is connected to the positive electrode side termination resistor Risp, the negative electrode side termination resistor Risn, the positive electrode side Y capacitor CY$p$, and the negative electrode side Y capacitor CY$n$.

Further, the ground fault detection device 10 includes a detection capacitor C1 that operates as a flying capacitor. As the detection capacitor C1, a capacitor having an electrostatic capacitance smaller than that of each of the Y capacitors described above is used.

Specifically, in the present embodiment, the magnitude relationship of the electrostatic capacitance of each capacitor is the detection capacitor C1<the vehicle positive electrode side Y capacitor CY1$p$=the vehicle negative electrode side Y capacitor CY1$n$<the charger positive electrode side Y capacitor CY2$p$=the charger negative electrode side Y capacitor CY2$n$. For example, the electrostatic capacitances of the vehicle positive electrode side Y capacitor CY1$p$ and the vehicle negative electrode side Y capacitor CY1$n$ are about several times the electrostatic capacitance of the detection capacitor C1, and the electrostatic capacitances of the charger positive electrode side Y capacitor CY2$p$ and the charger negative electrode side Y capacitor CY2$n$ are about several tens of times the electrostatic capacitance of the detection capacitor C1.

Further, in order to control the charging/discharging of the detection capacitor C1, the ground fault detection device 10 includes four switches of a first switch S1, a second switch S2, a third switch S3, and a fourth switch S4 around the detection capacitor C1. Further, the ground fault detection device 10 includes a measurement switch Sa for sampling a measurement voltage (that is, a charge voltage of a measurement capacitor Ca to be described later) corresponding to a charge voltage of the detection capacitor C1. The first switch S1, the second switch S2, the third switch S3, the fourth switch S4, and the measurement switch Sa are, for example, insulated switching elements such as an optical MOSFET.

Specifically, in the ground fault detection device 10, one end of the first switch S1 is connected to the positive electrode side (that is, the positive electrode side power supply line Lp) of the high-voltage battery BAT. The other end of the first switch S1 is connected to the anode side of a first diode D1. The cathode side of the first diode D1 is connected to one end of a first resistor R1 having a predetermined electric resistance value. The other end of the first resistor R1 is connected to one end (for example, a positive terminal) of the detection capacitor C1. As illustrated in FIG. 1, the first switch S1 and the first resistor R1 which are connected in series constitute a first circuit Ci1 which connects the positive electrode side of the high-voltage battery BAT and one end of the detection capacitor C1 in series.

In addition, in the ground fault detection device 10, one end of the second switch S2 is connected to the negative electrode side (that is, the negative electrode power supply line Ln) of the high-voltage battery BAT. The other end of the second switch S2 is connected to one end of a second resistor R2 having a predetermined electric resistance value. The other end of the second resistor R2 is connected to the other end (for example, a negative electrode terminal) of the detection capacitor C1. That is, the second switch S2 and the second resistor R2 connect the negative electrode side of the high-voltage battery BAT and the other end of the detection capacitor C1 in series.

In addition, in the ground fault detection device 10, one end of the third switch S3 is connected to one end of a third resistor R3 having a predetermined electric resistance value and the anode side of a second diode D2. The other end of the third switch S3 is connected to the ground GND4 via a fifth resistor R5 having a predetermined electric resistance value. That is, the third switch S3, the third resistor R3, and the fifth resistor R5 connect one end of the detection capacitor C1 to the ground GND4. The ground GND4 is, for example, the vehicle body. The ground GND4 may be common to the ground GND1 and the ground GND2.

The other end of the third switch S3 is also connected to one end of the measurement switch Sa. The other end of the measurement switch Sa is connected to one end of the measurement capacitor Ca and an input terminal (for example, an analog input terminal) of the control device 11. The other end of the measurement capacitor Ca is connected to the ground GND5. The ground GND5 is, for example, the vehicle body. The ground GND5 may be common to the ground GND1, the ground GND2, and the ground GND4.

For example, when the measurement switch Sa is on, a signal (for example, an analog signal) indicating the charging voltage of the measurement capacitor Ca is input from the input terminal of the control device 11 connected to one end of the measurement capacitor Ca to the control device 11, and the control device 11 can acquire the charging voltage of the measurement capacitor Ca based on the signal.

The cathode side of the second diode D2 is connected to the other end of the first resistor R1, one end of the detection capacitor C1, and the anode side of a third diode D3. The cathode side of the third diode D3 is connected to the other end of the third resistor R3.

In addition, in the ground fault detection device 10, one end of the fourth switch S4 is connected to the other end of the second resistor R2 and the other end of the detection capacitor C1. The other end of the fourth switch S4 is connected to the ground GND4 via a fourth resistor R4 having a predetermined electric resistance value. As illustrated in FIG. 1, the fourth switch S4 and the fourth resistor R4 which are connected in series constitute a second circuit Ci2 which connects the other end of the detection capacitor C1 and the ground GND4. The fourth resistor R4 is an example of a third resistor of the present invention.

The ground fault detection device 10 further includes the control device 11. The control device 11 is an example of a control unit in the present invention, and measures the voltage (charging voltage) of the detection capacitor C1, and controls on/off of each switch (for example, the first switch S1 to the fourth switch S4, the measurement switch Sa, and the fifth switch S5 described later) included in the ground fault detection device 10. The control device 11 is constituted by, for example, a microcomputer or the like, and executes various types of control required in the ground fault detection device 10 by executing a program incorporated in advance. An example of the control performed by the control device 11 will be described later with reference to FIG. 2 and the like.

The ground fault detection device 10 further includes a discharge circuit CD. One end of the discharge circuit CD is connected to a first circuit Ci1, and the other end of the discharge circuit CD is connected to a second circuit Ci2. Specifically, a connection point P1 between one end of the discharge circuit CD and the first circuit Ci1 is provided closer to the one end of the detection capacitor C1 than the first resistor R1 in the first circuit Ci1.

A connection point P2 between the other end of the discharge circuit CD and the second circuit Ci2 is provided closer to the other end of the detection capacitor C1 than the fourth resistor R4 in the second circuit Ci2. More specifically, the connection point P2 is provided closer to the other end of the detection capacitor C1 than the fourth switch S4.

The discharge circuit CD includes a fifth switch S5 and a discharge resistor R10. The fifth switch S5 is, for example, an insulated switching element such as an optical MOSFET. The discharge resistor R10 is a resistor having a predetermined electrical resistance value.

In the present embodiment, it is assumed that the electrical resistance value of one of the first resistor R1 and the discharge resistor R10 is larger than the electrical resistance value of the fourth resistor R4. For example, the electrical resistance value of the first resistor R1 can be several hundred [kΩ], the electrical resistance value of the fourth resistor R4 can be several hundred [Ω], and the electrical resistance value of the discharge resistor R10 can be several [kΩ].

As will be described in detail later, in the present embodiment, the electric charges of the positive electrode side Y capacitor CYp can be discharged to the ground GND4 via a circuit constituted by the first resistor R1, the discharge resistor R10, and the fourth resistor R4 which are connected in series. When the electric resistance value (that is, the combined resistance of the first resistor R1, the discharge resistor R10, and the fourth resistor R4 connected in series) of this circuit is small, a ground fault may occur when the electric charges of the positive electrode side Y capacitor CYp are discharged to the ground GND4 via the circuit.

In the present embodiment, the combined resistance of the first resistor R1, the discharge resistor R10, and the fourth resistor R4 connected in series is secured by setting the electrical resistance value of at least one of the first resistor R1 and the discharge resistor R10 to a somewhat large electrical resistance value as described above. As a result, it is possible to discharge the electric charges of the positive electrode side Y capacitor CYp to the ground GND4 while suppressing the occurrence of a ground fault.

On the other hand, when the combined resistance of the first resistor R1, the discharge resistor R10, and the fourth resistor R4 which are connected in series is too large, there is a possibility that it takes a long time to discharge the electric charges of the positive electrode side Y capacitor CYp to the ground GND4. In the present embodiment, by reducing the electric resistance value of the fourth resistor R4 that can be energized regardless of the on/off state of the fifth switch S5 (that is, on/off of the discharge circuit CD), the combined resistance of the first resistor R1, the discharge resistor R10, and the fourth resistor R4 connected in series is suppressed from becoming too large.

Although the first resistor R1 can be energized regardless of on/off of the fifth switch S5 similarly to the fourth resistor R4, it is preferable to use a resistor having an electric resistance value that is relatively large as the first resistor R1 from the viewpoint of securing the time until the charging of the detection capacitor C1 is completed.

[Ground Fault Detection by Ground Fault Detection Device]

Next, an example of a method of detecting a ground fault by the ground fault detection device 10 will be described with reference to FIGS. 2 to 4. For example, when the vehicle 1 is activated and when the vehicle 1 is charged by the charger 20, the control device 11 of the ground fault detection device 10 performs the ground fault detection process illustrated in FIG. 2 at a predetermined cycle.

Figure 2:
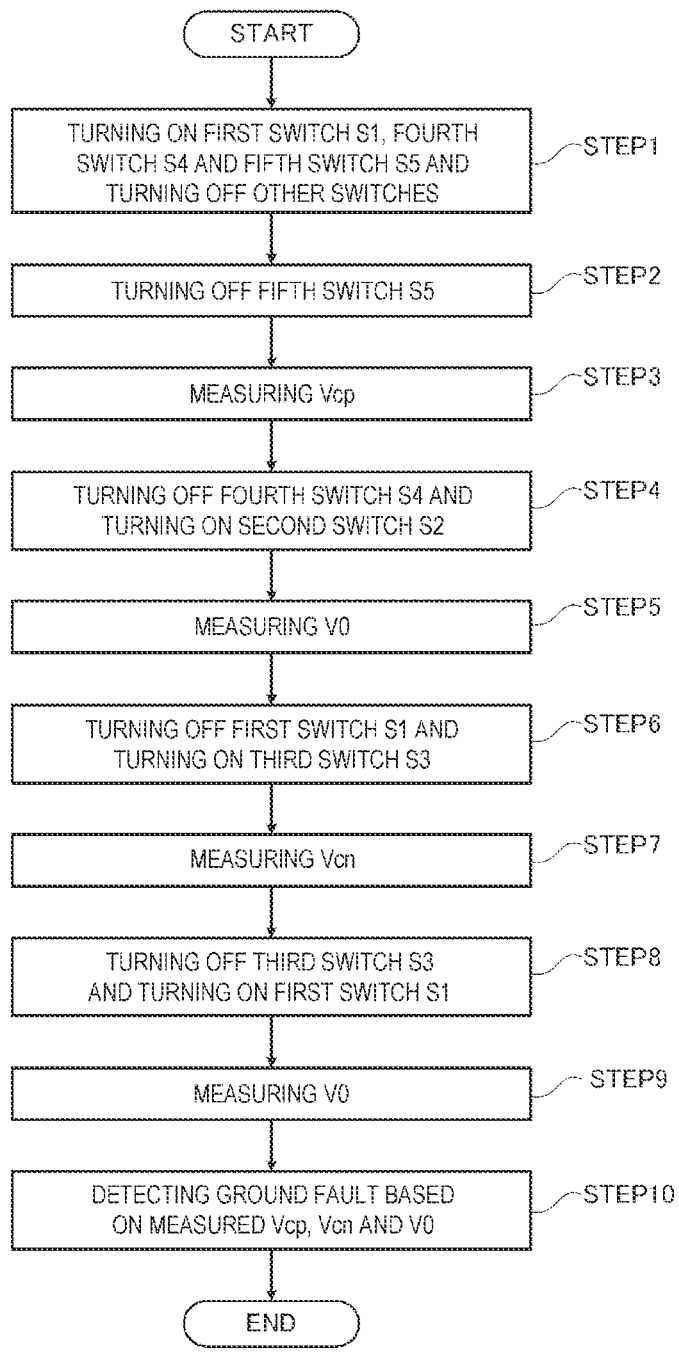
FIG. 2 is a flowchart illustrating an example of a ground fault detection process performed by a control device included in the ground fault detection device according to the present embodiment.

As illustrated in FIG. 2, first, the control device 11 turns on the first switch S1, the fourth switch S4, and the fifth switch S5, and turns off other switches (STEP 1). As a result of the process of STEP 1, the ground fault detection device 10 is in a state in which the first switch S1, the fourth switch S4, and the fifth switch S5 are on and the second switch S2 and the third switch S3 are off (hereinafter, also referred to as a positive electrode side Y capacitor discharge state).

Figure 3:
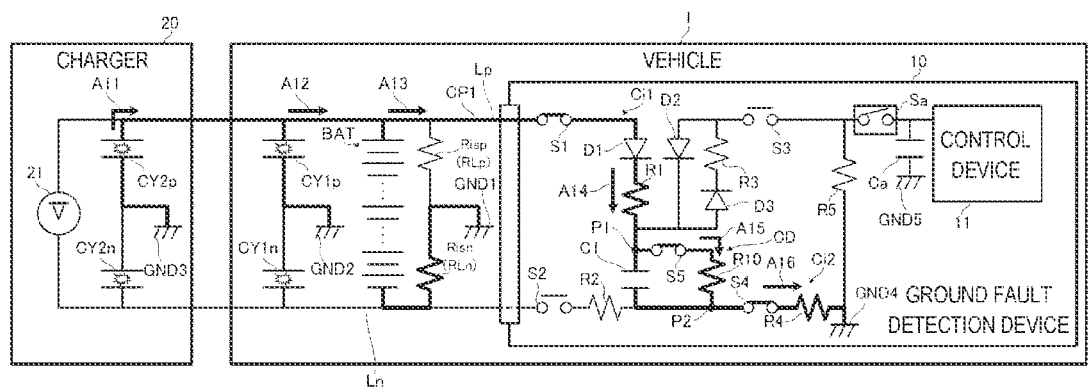
FIG. 3 is a diagram illustrating an example of a current path when the ground fault detection device of the present embodiment is in a positive electrode side Y capacitor discharge state.

FIG. 3 illustrates an example of a current path when the ground fault detection device 10 is in the positive electrode side Y capacitor discharge state. In FIG. 3, the same parts as those in FIG. 1 are denoted by the same reference numerals, and the description thereof is omitted as appropriate.

As indicated by the current path CP1 and the arrows A11 to A16 in FIG. 3, when the ground fault detection device 10 is in the positive electrode side Y capacitor discharge state, the electric charges accumulated in the positive electrode side Y capacitor CYp are discharged to the ground GND4 via the first switch S1, the first resistor R1, the discharge circuit CD, the fourth switch S4, and the fourth resistor R4. As a result, the charging voltage (that is, the potential) of the positive electrode side Y capacitor CYp becomes substantially 0.

When the ground fault detection device 10 is in the positive electrode side Y capacitor discharge state, the electric charges accumulated in the detection capacitor C1 are also discharged to the ground GND4. As a result, the charging voltage (that is, the potential) of the detection capacitor C1 also becomes substantially 0. The control device 11 maintains the positive electrode side Y capacitor discharge state of the ground fault detection device 10 for a predetermined period (for example, several hundred [ms]).

Next, the control device 11 turns off the fifth switch S5 from the positive electrode side Y capacitor discharge state (STEP 2). As a result of the process of STEP 2, the ground fault detection device 10 is in a state in which the first switch S1 and the fourth switch S4 are on and the second switch S2, the third switch S3, and the fifth switch S5 are off (hereinafter, also referred to as a positive electrode side voltage measurement state).

Figure 4:
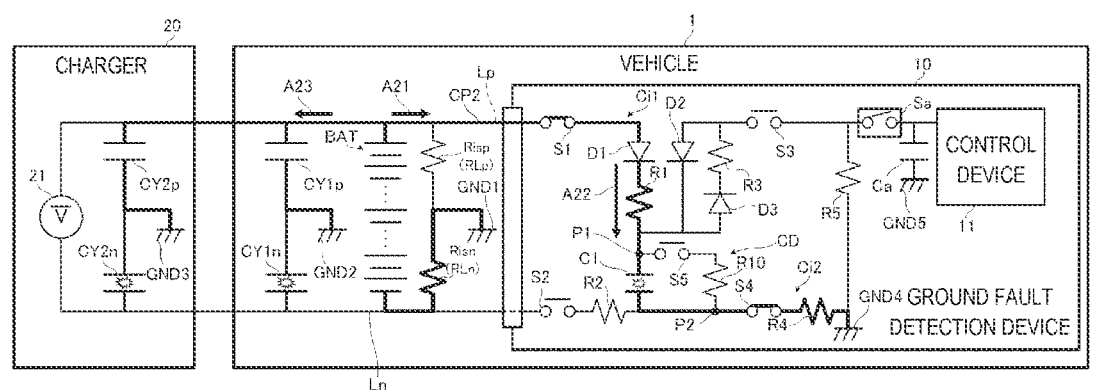
FIG. 4 is a diagram illustrating an example of a current path when the ground fault detection device of the present embodiment is in a positive electrode side voltage measurement state.

FIG. 4 illustrates an example of a current path when the ground fault detection device 10 is in the positive electrode side voltage measurement state. In FIG. 4, the same parts as those in FIG. 1 are denoted by the same reference numerals, and the description thereof is omitted as appropriate.

As indicated by the current path CP2 and the arrows A21 to A23 in FIG. 4, when the ground fault detection device 10 is in the positive electrode side voltage measurement state, the detection capacitor C1 is charged according to the voltage between the positive electrode side of the high-voltage battery BAT and the ground GND4. When the ground fault detection device 10 is in the positive electrode side voltage measurement state, the positive electrode side Y capacitor CYp is also charged in the same manner as the detection capacitor C1.

However, until a predetermined period elapses after the ground fault detection device 10 is in the positive electrode side voltage measurement state (for example, until the detection capacitor C1 is fully charged), the charging voltage of the detection capacitor C1 having a smaller electrostatic capacitance than the positive electrode side Y capacitor CYp is maintained at a voltage value equal to or higher than the charging voltage of the positive electrode side Y capacitor CYp. Therefore, the detection capacitor C1 is not charged by the electric charges of the positive electrode side Y capacitor CYp until a predetermined period elapses after the ground fault detection device 10 is in the positive electrode side voltage measurement state, and the charging voltage of the detection capacitor C1 in this period is not affected by the electric charges of the positive electrode side Y capacitor CYp.

Then, the control device 11 maintains the positive electrode side voltage measurement state of the ground fault detection device 10 for a predetermined period (period during which the detection capacitor C1 is fully charged, for example, several hundred [ms]) or less, and measures the charging voltage of the detection capacitor C1 when this period elapses as Vcp (STEP 3).

In measuring the charging voltage of the detection capacitor C1, the control device 11 turns off the first switch S1, the second switch S2, and the fifth switch S5, and turns on the third switch S3 and the fourth switch S4, and turns on the measurement switch Sa, for example. Thus, the measurement capacitor Ca is charged to the same voltage as the detection capacitor C1. Then, the control device 11 obtains the charging voltage of the charged measurement capacitor Ca as a measurement voltage corresponding to the charging voltage of the detection capacitor C1. Thus, the control device 11 can indirectly measure the charging voltage of the detection capacitor C1.

For example, when the measurement of the charging voltage of the measurement capacitor Ca (that is, the charging voltage of the detection capacitor C1) is completed, the control device 11 turns off the first switch S1 and the second switch S2, turns on the third switch S3 and the fourth switch S4, and discharges the detection capacitor C1. That is, when the measurement of the charging voltage of the measurement capacitor Ca is completed, the control device 11 sets the charging voltage of the detection capacitor C1 to 0.

Next, the control device 11 turns off the fourth switch S4 from the positive electrode side voltage measurement state and turns on the second switch S2 (STEP 4). As a result of the process of STEP 4, the ground fault detection device 10 is in a state in which the first switch S1 and the second switch S2 are on and the third switch S3, the fourth switch S4, and the fifth switch S5 are off (hereinafter, also referred to as an overall voltage measurement state).

Although illustration and detailed description are omitted, when the ground fault detection device 10 is in the overall voltage measurement state, the detection capacitor C1 is charged according to the voltage between the positive electrode side and the negative electrode side of the high-voltage battery BAT. The control device 11 maintains the overall voltage measurement state of the ground fault detection device 10 for a predetermined period (for example, several hundred [ms]), and measures the charging voltage of the detection capacitor C1 when this period has elapsed as V0 (STEP 5).

Next, the control device 11 turns off the first switch S1 from the overall voltage measurement state and turns on the third switch S3 (STEP 6). As a result of the process of STEP 6, the ground fault detection device 10 is in a state in which the second switch S2 and the third switch S3 are on and the first switch S1, the fourth switch S4, and the fifth switch S5 are off (hereinafter, also referred to as a negative electrode side voltage measurement state).

Although illustration and detailed description are omitted, when the ground fault detection device 10 in the negative electrode side voltage measurement state, the detection capacitor C1 is charged according to the voltage between the negative electrode side of the high-voltage battery BAT and the ground GND4. When the ground fault detection device 10 in the negative electrode side voltage measurement state, the negative electrode side Y capacitor CYn is also charged in the same manner as the detection capacitor C1.

The control device 11 maintains the negative electrode side voltage measurement state of the ground fault detection device 10 for a predetermined period (for example, several hundred [ms]), and measures the charging voltage of the detection capacitor C1 when this period has elapsed as Vcn (STEP 7).

Next, the control device 11 turns off the third switch S3 from the negative electrode side voltage measurement state, turns on the first switch S1 (STEP 8), puts the ground fault detection device 10 into the overall voltage measurement state again, and measures V0 in the same manner as in STEP 5 (STEP 9).

Then, the control device 11 detects a ground fault based on Vcp measured at STEP 3, Vcn measured at STEP 7, and V0 measured at STEP 5 or STEP 9 (STEP 10), and ends the process illustrated in FIG. 2.

As described above, the control device 11 of the ground fault detection device 10 is in the positive electrode side Y capacitor discharge state before the ground fault detection device 10 is in the positive electrode side voltage measurement state, and discharges the electric charges of the positive electrode side Y capacitor CYp to the ground GND4. As a result, the amount of electric charges flowing into the detection capacitor C1 from the positive electrode side Y capacitor CYp can be reduced when the positive electrode side voltage measurement state is set. As a result, Vcp which is less affected by the electric charge of the positive electrode side Y capacitor CYp can be measured, and the detection accuracy of the ground fault based on Vcp can be improved.

When the electric charges of the positive electrode side Y capacitor CYp are not discharged before the ground fault detection device 10 is in the positive electrode side voltage measurement state, the electric charges accumulated in the positive electrode side Y capacitor CYp may flow into the detection capacitor C1 when the positive electrode side voltage measurement state is set. Then, when the electric charges accumulated in the positive electrode side Y capacitor CYp flow into the detection capacitor C1, even when a ground fault does not occur in the vehicle 1, a large voltage value such as when a ground fault occurs can be measured as Vcp. As a result, even when a ground fault does not occur, the control device 11 may erroneously detect that a ground fault has occurred based on the Vcp of such a large voltage value.

On the other hand, as described above, according to the ground fault detection device 10, the electric charges of the positive electrode side Y capacitor CYp can be discharged before the ground fault detection device 10 is in the positive electrode side voltage measurement state, and Vcp which is less affected by the electric charges of the positive electrode side Y capacitor CYp can be measured, so that the above-mentioned false detection can be suppressed and the detection accuracy of the ground fault can be improved.

[First Modification]

Figure 5:
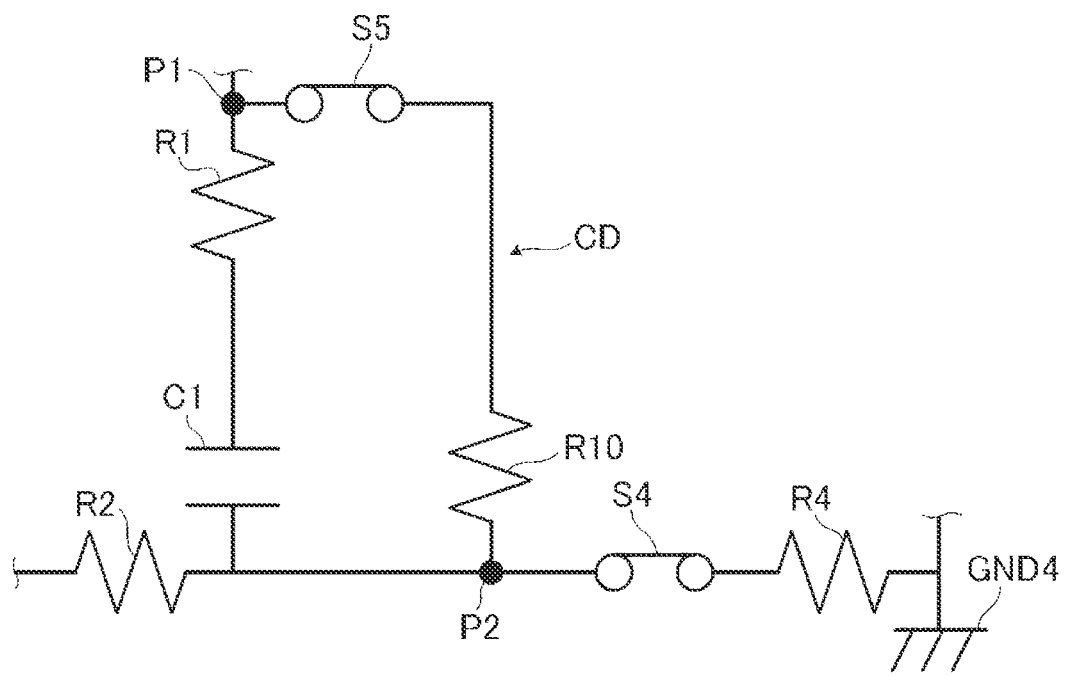
FIG. 5 is a diagram illustrating a first modification of the ground fault detection device of the present embodiment.

Next, a first modification of the ground fault detection device 10 of the above-described embodiment will be described with reference to FIG. 5. FIG. 5 illustrates the periphery of the discharge circuit CD in the ground fault detection device 10 of the first modification. Note that, in the ground fault detection device 10 of the first modification, the configuration of a portion not illustrated in FIG. 5 is the same as that of the ground fault detection device 10 illustrated in FIG. 1, and a description thereof will be omitted.

In the ground fault detection device 10 of the first modification, the electrical resistance value of the discharge resistor R10 or the fourth resistor R4 is large to a certain extent (for example, the combined resistance of the discharge resistor R10 and the fourth resistor R4 connected in series is about several hundred [k$\Omega$]). In such a case, as illustrated in FIG. 5, the connection point P1 between one end of the discharge circuit CD and the first circuit Ci1 may be provided closer to the positive electrode side of the high-voltage battery BAT than the first resistor R1. More specifically, the connection point P1 can be provided between the first switch S1 (more specifically, the first diode D1) and the first resistor R1.

As described above, when the electric resistance value of the discharge resistor R10 or the fourth resistor R4 is large to a certain extent, even when the connection point P1 is provided closer to the positive electrode side of the high-voltage battery BAT than the first resistor R1, the electric resistance value of the circuit (that is, the combined resistance of the discharge resistor R10 and the fourth resistor R4 connected in series) can be secured when the electric charges of the positive electrode side Y capacitor CYp are discharged to the ground GND4. As a result, it is possible to discharge the electric charges of the positive electrode side Y capacitor CYp to the ground GND4 while suppressing the occurrence of a ground fault.

[Second Modification]

Figure 6:
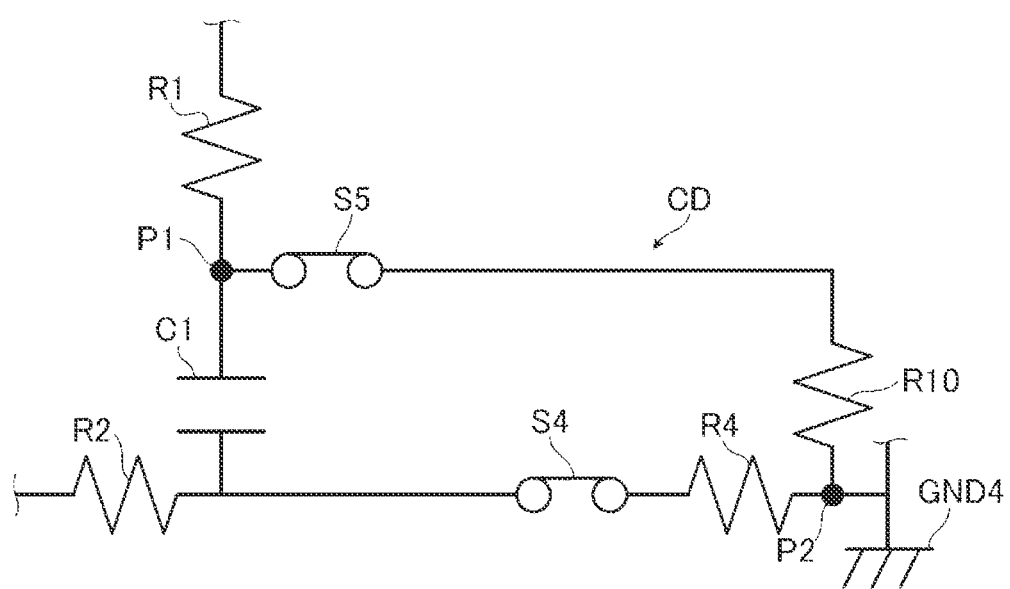
FIG. 6 is a diagram illustrating a second modification of the ground fault detection device of the present embodiment.

Next, a second modification of the ground fault detection device 10 of the above-described embodiment will be described with reference to FIG. 6. FIG. 6 illustrates the periphery of the discharge circuit CD in the ground fault detection device 10 of the second modification. In the ground fault detection device 10 of the second modification, the configuration of a portion not illustrated in FIG. 6 is the same as that of the ground fault detection device 10 illustrated in FIG. 1, and a description thereof will be omitted.

In the ground fault detection device 10 of the second modification, the electrical resistance value of the first resistor R1 or the discharge resistor R10 is large to a certain extent (for example, the combined resistance of the first resistor R1 and the discharge resistor R10 connected in series is about several hundreds of times). In such a case, as illustrated in FIG. 6, the connection point P2 between the other end of the discharge circuit CD and the second circuit Ci2 may be provided closer to the ground GND4 than the fourth resistor R4. More specifically, the connection point P2 can be provided between the fourth resistor R4 and the ground GND4.

As described above, when the electric resistance value of the first resistor R1 or the discharge resistor R10 is large to a certain extent, even when the connection point P2 is provided closer to the ground GND4 than the fourth resistor R4, the electric resistance value of the circuit (that is, the combined resistance of the first resistor R1 and the discharge resistor R10 connected in series) can be secured when the electric charges of the positive electrode side Y capacitor CYp are discharged to the ground GND4. As a result, it is possible to discharge the electric charges of the positive electrode side Y capacitor CYp to the ground GND4 while suppressing the occurrence of a ground fault.

[Third Modification]

Figure 7:
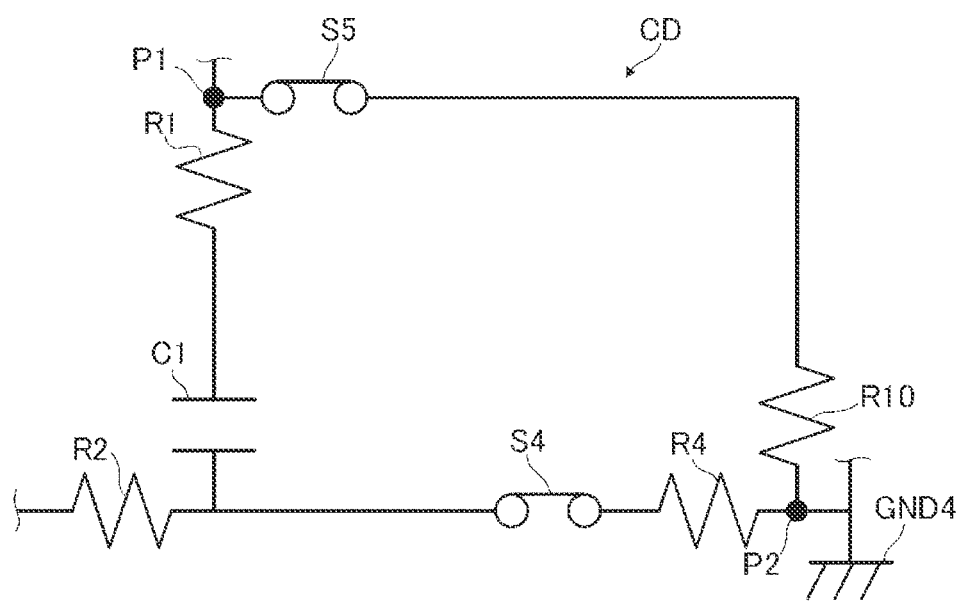
FIG. 7 is a diagram illustrating a third modification of the ground fault detection device of the present embodiment.

Next, a third modification of the ground fault detection device 10 of the above-described embodiment will be described with reference to FIG. 7. FIG. 7 illustrates the periphery of the discharge circuit CD in the ground fault detection device 10 of the third modification. In the ground fault detection device 10 of the third modification, the configuration of a portion not illustrated in FIG. 7 is the same as that of the ground fault detection device 10 illustrated in FIG. 1, and a description thereof will be omitted.

In the ground fault detection device 10 of the third modification, the electrical resistance value of the discharge resistor R10 is large to a certain extent (for example, several hundred [kΩ] like the first resistor R1). In such a case, as illustrated in FIG. 7, the connection point P1 between one end of the discharge circuit CD and the first circuit Ci1 may be provided closer to the positive electrode side of the high-voltage battery BAT than the first resistor R1, and the connection point P2 between the other end of the discharge circuit CD and the second circuit Ci2 may be provided closer to the ground GND4 than the fourth resistor R4. More specifically, the connection point P1 can be provided between the first switch S1 (more specifically, the first diode D1) and the first resistor R1. The connection point P2 can be provided between the fourth resistor R4 and the ground GND4.

As described above, when the electric resistance value of the discharge resistor R10 is large to a certain extent, even when the connection point P1 is provided closer to the positive electrode side of the high-voltage battery BAT than the first resistor R1 and the connection point P2 is provided closer to the ground GND4 than the fourth resistor R4, the electric resistance value of the circuit (that is, the electric resistance value of the discharge resistor R10) can be secured when the electric charges of the positive electrode side Y capacitor CYp are discharged to the ground GND4. As a result, it is possible to discharge the electric charges of the positive electrode side Y capacitor CYp to the ground GND4 while suppressing the occurrence of a ground fault.

[Fourth Modification]

Figure 8:
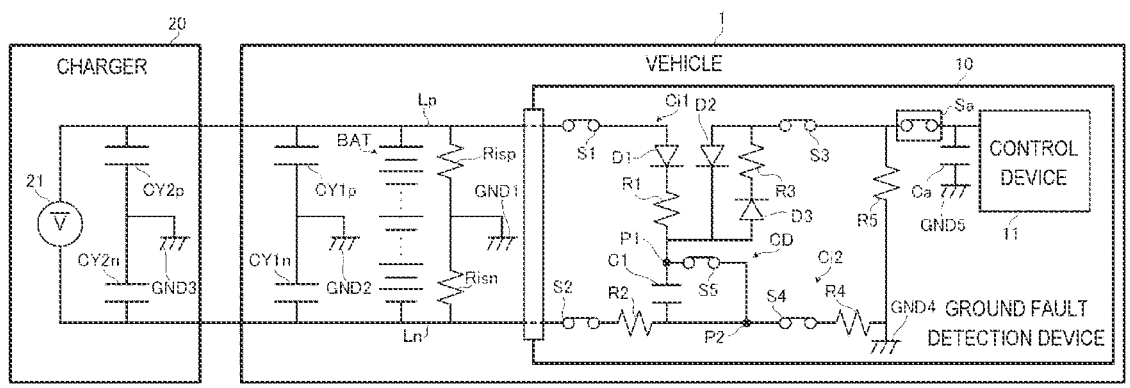
FIG. 8 is a diagram illustrating a fourth modification of the ground fault detection device of the present embodiment.

Next, a fourth modification of the ground fault detection device 10 of the above-described embodiment will be described with reference to FIG. 8. In the ground fault detection device 10 of the fourth modification, the difference from the ground fault detection device 10 illustrated in FIG. 1 is that the discharge circuit CD does not include the discharge resistor R10, and the other parts are the same as those of the ground fault detecting device 10 illustrated in FIG. 1 and the description thereof will be omitted.

In the ground fault detection device 10 of the fourth modification, the electrical resistance value of the first resistor R1 or the fourth resistor R4 is large to a certain extent (for example, the combined resistance of the first resistor R1 and the fourth resistor R4 connected in series is about several hundred [kΩ]). In such a case, as illustrated in FIG. 8, the discharge resistor R10 may not be provided in the discharge circuit CD. More specifically, the discharge circuit CD may be configured only by the fifth switch S5.

As described above, when the electric resistance value of the first resistor R1 or the fourth resistor R4 is large to a certain extent, the electric resistance value of the circuit (that is, the combined resistance of the first resistor R1 and the fourth resistor R4 connected in series) can be secured when the electric charges of the positive electrode side Y capacitor CYp are discharged to the ground GND4 without providing the discharge resistor R10 in the discharge circuit CD. As a result, it is possible to discharge the electric charges of the positive electrode side Y capacitor CYp to the ground GND4 while suppressing the occurrence of a ground fault.

The present invention is not limited to the embodiments described above, and modifications, improvements, or the like can be made as appropriate.

For example, although the vehicle 1 is an electric automatic vehicle or a hybrid electric vehicle in the above-described embodiments, the vehicle 1 may be a fuel cell vehicle.

Further, in the embodiment described above, the example in which the electric charges of the positive electrode side Y capacitor CYp are discharged before the ground fault detection device 10 is in the positive electrode side voltage measurement state has been described, but the electric charges of the negative electrode side Y capacitor CYn may be discharged before the ground fault detection device is in the negative electrode side voltage measurement state. Specifically, for example, the control device 11 turns on the second switch S2, the third switch S3, and the fifth switch S5 and turns off the first switch S1 and the fourth switch S4 before the negative electrode side voltage measurement state is set.

By setting the ground fault detection device 10 to the negative electrode side Y capacitor discharge state, the electric charges accumulated in the negative electrode side Y capacitor CYn can be discharged to the ground GND4 via the second switch S2, the second resistor R2, the discharge circuit CD, the third resistor R3, the third switch S3, and the fifth resistor R5. In this way, by setting the ground fault detection device 10 to the negative electrode side Y capacitor discharge state before the ground fault detection device is in the negative electrode side voltage measurement state, the electric charges of the negative electrode side Y capacitor CYn are discharged, so that the electric charges flowing into the detection capacitor C1 from the negative electrode side Y capacitor CYn can be reduced when the negative electrode side voltage measurement state is set.

As a result, Vcn which is less affected by the electric charges of the negative electrode side Y capacitor CYn can be measured, and detection accuracy of a ground fault based on Vcn can be improved. When the electric charges of the positive electrode side Y capacitor CYp are discharged before the ground fault detection device 10 is in the positive electrode side voltage measurement state, and the electric charges of the negative electrode side Y capacitor CYn are discharged before the ground fault detection device 10 is in the negative electrode side voltage measurement state, the detection accuracy of the ground fault based on Vcp and Vcn can be further improved.

In the above-described embodiments, one end of the discharge circuit CD is provided on the first circuit Ci1. A circuit that connects the positive electrode side of the high-voltage battery BAT and one end of the detection capacitor C1 may be provided separately from the first circuit Ci1, and one end of the discharge circuit CD may be connected to the circuit.

In the above-described embodiments, the other end of the discharge circuit CD is provided on the second circuit Ci2, but the present invention is not limited thereto. A circuit that connects the other end of the detection capacitor C1 and the ground GND4 may be provided separately from the second circuit Ci2, and the other end of the discharge circuit CD may be connected to the circuit.

At least the following matters are described in the present description. Components and the like corresponding to the above-described embodiments are shown in parentheses, but the present invention is not limited thereto.

(1) A ground fault detection device (ground fault detection device 10) connected to a high-voltage battery (high-voltage battery BAT) and configured to detect a decrease in insulation resistance of a system provided with the high-voltage battery, the ground fault detection device including:

a detection capacitor (detection capacitor C1) operating as a flying capacitor;

a control unit (control device 11) configured to measure a voltage of the detection capacitor;

a first switch (first switch S1) and a first resistor (first resistor R1) connecting a positive electrode side of the high-voltage battery and one end of the detection capacitor in series;

a second switch (second switch S2) and a second resistor (second resistor R2) connecting the negative electrode side of the high-voltage battery and an another end of the detection capacitor in series;

a third switch (third switch S3) connecting the one end of the detection capacitor and the ground;

a fourth switch (fourth switch S4) connecting the another end of the detection capacitor and the ground; and a discharge circuit (discharge circuit CD) including at least a fifth switch (fifth switch S5), having one end connected to a first circuit (first circuit Ci1) that connects the positive electrode side of the high-voltage battery and the one end of the detection capacitor, and having an another end connected to a second circuit (second circuit Ci2) that connects the another end of the detection capacitor and the ground, in which the ground fault detection device is connected to:

a positive electrode side termination resistor (positive electrode side termination resistor Risp) that connects the positive electrode side of the high-voltage battery and the ground, a negative electrode side termination resistor (negative electrode side termination resistor Risn) that connects the negative electrode side of the high-voltage battery and the ground, a positive electrode side Y capacitor (positive electrode side Y capacitor CYp) that connects the positive electrode side of the high-voltage battery and the ground in parallel with the positive electrode side termination resistor, and a negative electrode side Y capacitor (negative electrode side Y capacitor CYn) that connects the negative electrode side of the high voltage battery and the ground in parallel with the negative electrode side termination resistor.

According to (1), there is provided the discharge circuit including the fifth switch, one end of which is connected to the first circuit which connects the positive electrode side of the high-voltage battery to the one end of the detection capacitor, and the other end of which is connected to the second circuit which connects the other end of the detection capacitor and the ground. Accordingly, since the electric charges of the positive electrode side Y capacitor can be discharged to the ground via the discharge circuit, the electric charge flowing into the detection capacitor from the positive electrode side Y capacitor can be reduced when the positive electrode side Y capacitor and the detection capacitor are connected.

(2) The ground fault detection device according to (1), in which the first circuit is the first switch and the first resistor that connect the positive electrode side of the high-voltage battery and the one end of the detection capacitor in series, the second circuit is the fourth switch and the third resistor (fourth resistor R4) that connect the another end of the detection capacitor and the ground in series, the one end of the discharge circuit is connected to a point closer to the one end of the detection capacitor than the first resistor in the first circuit, and the another end of the discharge circuit is connected to a point closer to the another end of the detection capacitor than the third resistor in the second circuit.

According to (2), the electric resistance value of the circuit can be secured when the electric charges of the positive electrode side Y capacitor are discharged to the ground, and the electric charges of the positive electrode side Y capacitor can be discharged to the ground while suppressing the occurrence of a ground fault.

(3) The ground fault detection device according to (2), in which the discharge circuit further includes a discharge resistor (discharge resistor R10), and the electrical resistance value of at least one of the first resistor and the discharge resistor is greater than the electrical resistance value of the third resistor.

According to (3), the electric resistance value of the circuit can be secured when the electric charges of the positive electrode side Y capacitor are discharged to the ground, and the electric charges of the positive electrode side Y capacitor can be discharged to the ground while suppressing the occurrence of a ground fault.

(4) The ground fault detection device according to (2), in which an electric resistance value of the first resistor is larger than an electric resistance value of the third resistor.

According to (4), the electric resistance value of the circuit can be secured when the electric charges of the positive electrode side Y capacitor are discharged to the ground, and the electric charges of the positive electrode side Y capacitor are discharged to the ground while suppressing the occurrence of a ground fault.

What is claimed is:

1. A ground fault detection device connected to a system provided with a high-voltage battery and configured to detect a decrease in insulation resistance of the system, the system comprising: the high-voltage battery; a positive electrode side power line to which a positive electrode terminal of the high-voltage battery is connected; a negative electrode side power line to which a negative electrode terminal of the high-voltage battery is connected; a positive electrode side termination resistor and a positive electrode side Y capacitor connected in parallel between the positive electrode side power line and a ground; and a negative electrode side termination resistor and a negative electrode side Y capacitor connected in parallel between the negative electrode side power line and the ground, and the ground fault detection device comprising:

a detection capacitor operating as a flying capacitor;

a control unit configured to measure a voltage of the detection capacitor;

a first switch and a first resistor connected in series with each other between the positive electrode side power line and one end of the detection capacitor;

a second switch and a second resistor connected in series with each other between the negative electrode side power line and an another end of the detection capacitor;

a third switch connecting the one end of the detection capacitor and the ground;

a fourth switch connecting the another end of the detection capacitor and the ground;

a discharge circuit including at least a fifth switch configured to switch on and off the discharge circuit;

a first circuit connecting the positive electrode side power line and the one end of the detection capacitor;

a second circuit connecting the another end of the detection capacitor and the ground, wherein a one end of the discharge circuit is connected to the first circuit and another end of the discharge circuit is connected to the second circuit, the first circuit is the first switch and the first resistor that are connected in series with each other between the positive electrode side power line and the one end of the detection capacitor, the second circuit is the fourth switch and the third resistor that are connected in series with each other between the another end of the detection capacitor and the ground, the one end of the discharge circuit is connected to a point closer to the one end of the detection capacitor than the first resistor in the first circuit, and the another end of the discharge circuit is connected to a point closer to the another end of the detection capacitor than the third resistor in the second circuit.

2. The ground fault detection device according to claim 1, wherein the discharge circuit further includes a discharge resistor, and the electrical resistance value of at least one of the first resistor and the discharge resistor is greater than the electrical resistance value of the third resistor.

3. The ground fault detection device according to claim 1, wherein an electric resistance value of the first resistor is larger than an electric resistance value of the third resistor.

* * * * *